United States Patent
Mann

(10) Patent No.: US 6,838,651 B1
(45) Date of Patent: Jan. 4, 2005

(54) HIGH SENSITIVITY SNAP SHOT CMOS IMAGE SENSOR

(75) Inventor: Richard A. Mann, Torrance, CA (US)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 10/113,545

(22) Filed: Mar. 28, 2002

(51) Int. Cl.$^7$ .............................................. H01L 27/00
(52) U.S. Cl. .............................. 250/208.1; 250/214 DC; 250/226
(58) Field of Search ...................... 250/208.1, 214 DC, 250/226, 214 R; 356/416, 419; 341/155; 348/272, 294, 273, 280, 266; 358/474, 482

(56) References Cited

U.S. PATENT DOCUMENTS

| | | | | |
|---|---|---|---|---|
| 3,971,065 A | * | 7/1976 | Bayer | 348/276 |
| 5,461,425 A | * | 10/1995 | Fowler et al. | 348/294 |
| 6,380,880 B1 | * | 4/2002 | Bidermann | 341/155 |
| 6,611,289 B1 | * | 8/2003 | Yu et al. | 348/265 |

* cited by examiner

Primary Examiner—Thanh X. Luu
Assistant Examiner—Seung C. Sohn

(74) Attorney, Agent, or Firm—Farjami & Farjami LLP

(57) ABSTRACT

The present invention is directed to a solid state imaging device comprising a red pixel, a blue pixel, a first green pixel, a second green pixel, two analog-to-digital converters and a color interpolation circuit. The first analog-to-digital converter converts the output of the red pixel and output of the blue pixel into digital signals. The second analog-to-digital converter converts the output of the first green pixel and output of the second green pixel into digital signals. The color interpolation circuit combines the digital signals to determine the color of the pixel.

The solid state imaging device may further comprise a third analog-to-digital converter, a fourth analog-to-digital converter, a programmable clock generator and a control. The third analog-to-digital converter converts the output of the blue pixel into a digital signal and the fourth analog-to-digital converter converts the output of the second green pixel into a digital signal. The programmable clock generator has a first clock frequency and a second clock frequency, where the first clock frequency is slower than the second clock frequency. The control is coupled to the programmable clock generator, the third analog-to-digital converter and the fourth analog-to-digital converter. The control deactivates the third and fourth analog-to-digital converters if the programmable clock generator is at the first clock frequency, and the control activates the third and fourth analog-to-digital converters if the programmable clock generator is at the second clock frequency.

22 Claims, 3 Drawing Sheets

HIGH SENSITIVITY SNAP SHOT CMOS IMAGE SENSOR

TECHNICAL FIELD

This invention relates generally to solid-state imaging devices such as Complementary Metal Oxide Semiconductor ("CMOS") solid-state imagers. More particularly the invention relates to a solid-state imaging device implementing multiple analog-to-digital ("A/D") converters to obtain high frame rates.

BACKGROUND OF THE INVENTION

Solid-state image sensors (also known as "image sensors," "imagers," or "solid-state imagers") have broad applications in many areas including commercial, consumer, industrial, medical, defense and scientific fields. Solid-state image sensors convert a received image such as from an object into a signal indicative of the received image. Examples of solid-state image sensors including charge coupled devices ("CCD"), photodiode arrays, charge injection devices ("CID"), hybrid focal plane arrays and complementary metal oxide semiconductor ("CMOS") imaging devices.

Solid-state image sensors are fabricated from semiconductor materials (such as silicon or gallium arsenide) and include imaging arrays of light detecting (i.e., photosensitive) elements (also known as photodetectors) interconnected to generate analog signals representative of an image illuminating the device. These imaging arrays are typically formed from rows and columns of photodetectors (such as photodiodes, photoconductors, photocapacitors or photogates), each of which generate photo-charges. The photo-charges are the result of photons striking the surface of the semiconductor material of the photodetector, which generate free charge carriers (electron-hole pairs) in an amount linearly proportional to the incident photon radiation.

Each photodetector in the imaging array receives a portion of the light reflected from the object received at the solid-state image sensor. Each portion is known as a picture element or "pixel." Each individual pixel provides an output signal corresponding to the radiation intensity falling upon its detecting area (also known as the photosensitive or detector area) defined by the physical dimensions of the photodetector. The photo-charges from each pixel are converted to a signal (charge signal) or an electrical potential representative of the energy level reflected from a respective portion of the object. The resulting signal or potential is read and processed by video processing circuitry to create an electrical representation of the image. This signal may be utilized, for example, to display a corresponding image on a monitor or otherwise used to provide information about the optical image.

CCDs are commonly utilized as solid-state image sensors. However, CMOS technology has made significant strides in competing with CCD technology as the solid-state image sensor of choice for use in various applications such as stand-alone digital cameras and digital cameras embedded in other imaging devices (e.g., cellular phones and personal digital assistants). The principal advantages of CMOS technology are lower power consumption, higher levels of system integration that enable the creation of "camera-on-a-chip" capabilities, the ability to support very high data rates and the ease of manufacturing through the utilization of standard CMOS wafer fabrication facilities.

In video systems, CMOS technology is capable of higher frame rates than CCD technology at the same or lower levels of circuit noise because many of the elements can be designed to operate in parallel. In CCD circuits, a single amplifier transforms the received charge to voltage and supports the total data rate of the solid-state image sensor's frame rate. In CCD solid-state image sensors, the amplifier noise generally becomes dominant when 30 frames per second (FPS) is employed for image sizes over several hundred thousand pixels.

CMOS solid-state image sensors, on the other hand, utilize multiple amplifiers that allow a longer settling time between applications and higher frame rate while maintaining excellent noise rejection. In addition, CMOS solid-state image sensors may easily be equipped with a precision analog-to-digital ("A/D") converter on the solid-state image sensor chip.

In many imaging applications, it is often desirable to take a snap shot of a video image (i.e., to obtain a still image). Unfortunately, because video images are not generally of the highest quality, the snap shot of the still image will also not be of the highest quality. Such snap shots are especially inferior when compared with typical still images generated in accordance with any one of a number of still image techniques or standards generally known in the art. Typically, these higher quality still images are generated utilizing specialized image generation software.

Generally, conventional CCD solid-state imager sensors provide snap shot capability through an interline transfer approach. In the interline transfer approach, when a short exposure is required to freeze the action, the charge is transferred from the light collection junction to a junction shielded from light. The information regarding the light level is then stored on a storage node in the dark until the frame can be read. This method typically reduces motion blur and allows motion to be frozen even when the time to read the entire frame is much longer than the integration time for the exposure.

Conventional CMOS solid-state image sensors have also attempted to solve this snap shot capability problem by incorporating a storage node in the cell. However, this storage node must allow the transfer of the charge from the light collection nodes to the storage nodes, which requires an additional transistor in the cell. Such active pixel sensors are often termed four-transistor cells to distinguish them from the three-transistor active pixel sensor in CMOS solid-state image sensors. Typically, the transfer of charge from the light collection node to the storage node introduces additional reset or kT/C noise unless a very specialized field effect transistor ("FET") design is used. Additionally, cross talk may cause the storage node to continue to respond to light at 10% to 20% of the response of the lighted node. Moreover, the area required to implement the storage node also reduces the area available for light collection. Generally, for small pitch solid-state image sensor cells, the installation of a storage node reduces the available area for light collection by about 30% to 50%. The combined effects of less light collection area, transfer kT/C noise and cross talk may cause the four-transistor cell to have a signal-to-noise performance that is about ⅓ that of a conventional three-transistor cell of the same pitch. Therefore, there is a need for a high performance solid-state image sensor that solves the snap shot capability problem.

SUMMARY

A number of technical advances are achieved in the art by combining multiple A/D converters in a single CMOS imager camera chip to attain very high frame rates. There are four color channels (one red, one blue and two greens) used to define a color image based upon the Bayer Pattern of color filters. Since each of the color signals must receive an independent gain and offset adjustment as part of the image color reconstruction, it is natural to use a separate A/D converter for each of the color channels. In the alternative, two A/D converters may be employed, where one A/D converter is used for the red and blue channels and the second A/D converter is used for the green channels. In this manner, there is no addition to the fixed pattern noise of the imager that would arise from mismatch or offset in the two A/D converters.

A CMOS imager system with a variable frame rate can be employed to accommodate very high frame rates (>60 FPS) for digital still applications to freeze motion, and lower frame rates (~30 FPS) for viewfinder or motion picture application. The variable frame rate saves power during continuous operation as the high frame rate for digital still application is employed only during the capture of a still picture at high shutter speed. Preferably, the variable frame rate is controlled by a programmable clock frequency for the imager core. When the frame rate is low, the imager core is clocked more slowly. As the frame rate is increased, a higher clock rate is applied to the imager core. For power savings, only two of the four analog-to-digital converters will be selected for low frame rates. When a high frame rate is selected, the additional analog-to-digital converters will be powered.

For example, a solid state imaging device of the present invention comprises a red pixel, a blue pixel, a first green pixel, a second green pixel, two analog-to-digital converters and a color interpolation circuit. The first analog-to-digital converter converts the outputs of the red pixel and the blue pixel into digital signals. The second analog-to-digital converter converts the outputs of the first green pixel and the second green pixel into digital signals. The color interpolation circuit combines the digital signals.

The solid state imaging device may further comprise a third analog-to-digital converter, a fourth analog-to-digital converter, a programmable clock generator and a control. The third analog-to-digital converter converts the output of the blue pixel into a digital signal and the fourth analog-to-digital converter converts the output of the second green pixel into a digital signal. The programmable clock generator has a first clock frequency and a second clock frequency, where the first clock frequency is slower than the second clock frequency. The control is coupled to the programmable clock generator, the third analog-to-digital converter and the fourth analog-to-digital converter. The control deactivates the third and fourth analog-to-digital converters if the programmable clock generator is at the first clock frequency, and the control activates the third and fourth analog-to-digital converters if the programmable clock generator is at the second clock frequency.

In another example, a solid state imaging device of the present invention comprises a red pixel, a blue pixel, a first green pixel, a second green pixel, four analog-to-digital converters and a color interpolation circuit. The first analog-to-digital converter converts the output of the red pixel into a digital signal. The second analog-to-digital converter converts the output of the blue pixel into a digital signal. The third analog-to-digital converter converts the output of the first green pixel into a digital signal. The fourth analog-to-digital converter converts the output of the second green pixel into a digital signal. The color interpolation circuit combines the four digital signals.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principals of the invention. Moreover, in the figures, like reference numerals designate corresponding parts throughout the different views.

DETAILED DESCRIPTION OF THE PREFERRED EMBODIMENTS

Figure 1:
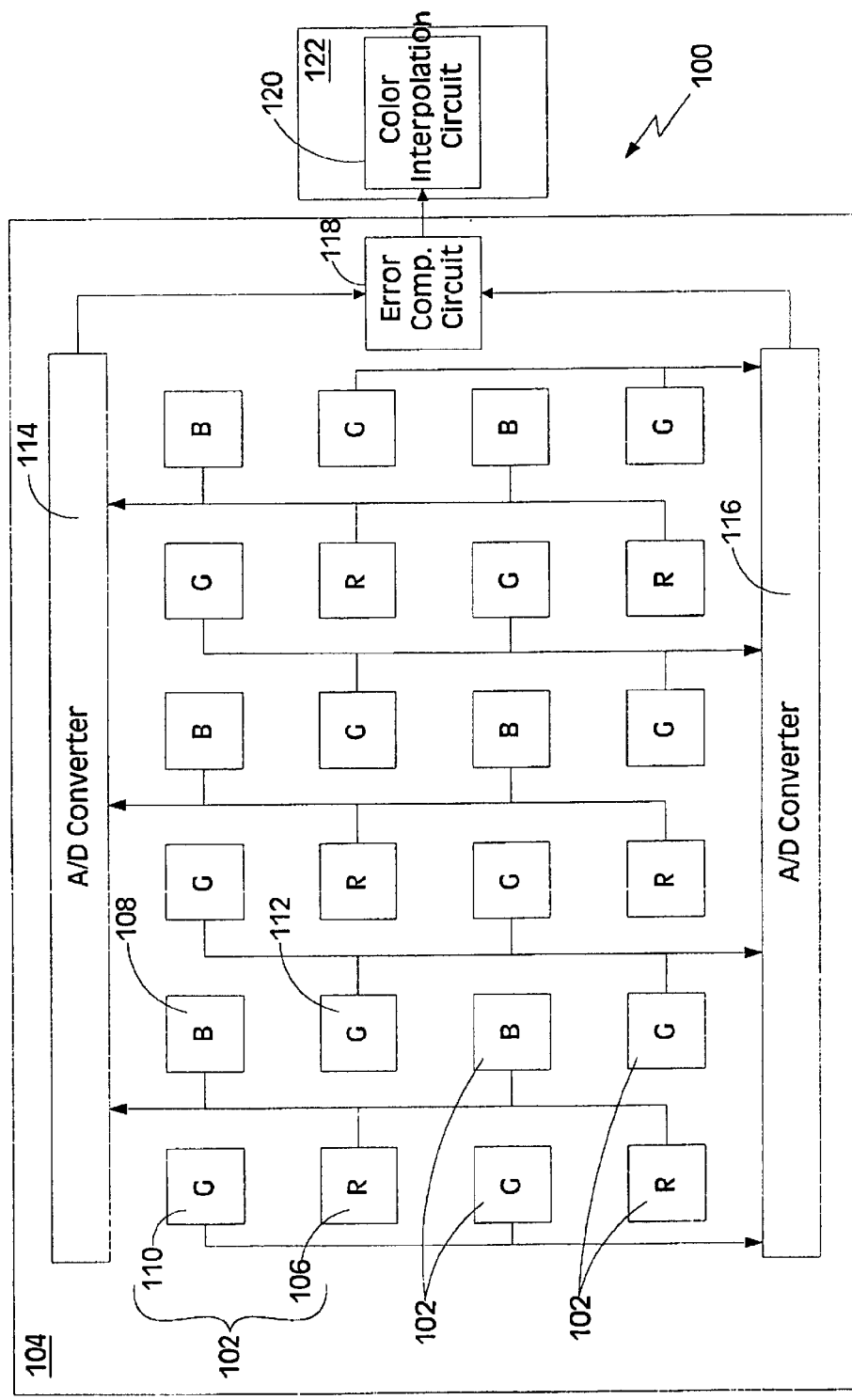
FIG. 1 illustrates a block diagram of a solid state imaging device having two analog-to-digital converters, in accordance with the present invention.

FIG. 1 illustrates a solid state imaging device 100 in accordance with the present invention. The imaging device 100 comprises a two-dimensional array of image pixels 102 disposed on a chip 104 using four color channels (one red, one blue and two greens) to define a color image. Each pixel 102 is either a red pixel 106 having a red photodiode, a blue pixel 108 having a blue photodiode or a green pixel 110, 112 having a green photodiode. The standard approach uses identical photodiode construction for each of the sensing elements. The green photodiode responds to green light since only green light is allowed to strike the photodiode through the filter element. In a similar manner, a preferential response is created to blue and red light.

The output of each pixel 102 is a signal proportional to the amount of light incident on the pixel 102. Accordingly, the output of the red pixel 106 is a signal proportional to the amount of red light incident on the pixel 106. Similarly, the output of the blue pixel 108 is a signal proportional to the amount of blue light incident on the pixel 108 and the output of the green pixels 110, 112 is a signal proportional to the amount of green light incident on the pixels 110, 112.

The solid state imaging device of the present invention defines a color image based upon the Bayer pattern of color filters. In particular, the imager system comprises green pixels 110, 112 in checkerboard pattern. Thus, the green pixels 110, 112 exist in both odd rows (110) and even rows (112). The blue pixels 108 are shown alternating with the green pixels 110 in the odd rows, and the red pixels 106 are shown alternating with the green pixels 110 in the even rows. Alternatively, the blue pixels 108 may alternate with the green pixels 112 in the even rows and the red pixels 106 may alternate with the green pixels 110 in the odd rows.

The imaging device 100 also comprises a first analog-to-digital converter 114, a second analog-to-digital converter 116, an error compensating circuit 118 and a color interpolation circuit 120. The first analog-to-digital converter 114 is disposed on the chip 104, and converts the outputs of the red pixels 106 and the blue pixels 108 into digital signals. The second analog-to-digital converter 116 is also disposed on the chip 104, and converts the outputs of the green pixels 110, 112 into digital signals. The error compensation circuit 118 provides an independent gain to correct the gain for each color channel. The error compensation circuit 118 also provides an independent offset to correct the fixed pattern noise offset for each color channel. Small adjustments to the gain and offset can be self-calibrated by the imager 100 by the self-testing of black and white reference rows each time the imager 100 is powered. The correction coefficients for the pair of green A/D converters 116 can then be automatically derived and stored on chip static RAM.

Color interpolation is used to determine the amount of red, green and blue light incident on each pixel. This process averages the color outputs of appropriate neighboring pixels to approximate each pixel's unknown color data. For example, for any given blue pixel 108, the process of color interpolation determines the green content of the pixel 108 by averaging the outputs of the green pixels 110, 112 above, below, to the left and to the right of the pixel 108. Similarly, the red content of the pixel 108 is determined by averaging the outputs of the red pixels 106 diagonally adjacent to the pixel 108. The color interpolation circuit 120 performs the interpolation for each pixel 102 to determine the color of the pixel 102. The color interpolation circuit 120 may be located on a second chip 122, as shown in FIG. 1. Alternatively, the color interpolation circuit 120 may be located on chip 104.

Figure 2:
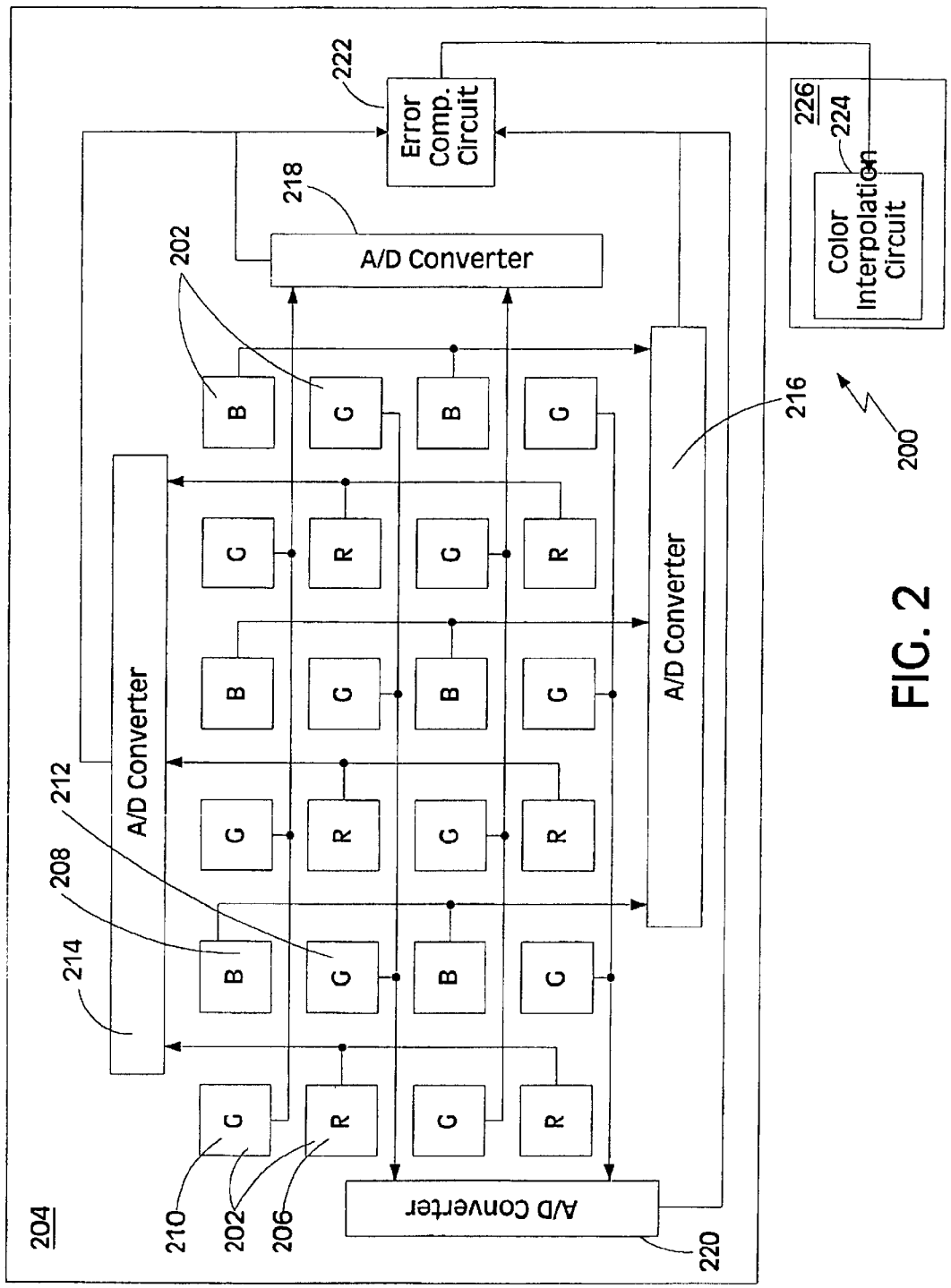
FIG. 2 illustrates a block diagram of a solid state imaging device having four analog-to-digital converters, in accordance with the present invention.

FIG. 2 illustrates a second example of a solid state imaging device 200 in accordance with the present invention. Similar to the imaging device 100 of FIG. 1, the imaging device 200 comprises a two-dimensional array of image pixels 202 disposed on a chip 204. Each pixel 202 is a red pixel 206, a blue pixel 208, or a green pixel 210, 212. The imaging device 200 also comprises four A/D converters 214, 216, 218, 220, an error compensation circuit 222 and a color interpolation circuit 224. The first A/D converter 214 converts the outputs of the red pixels 206 into digital signals, the second A/D converter 216 converts the outputs of the blue pixels 208 into digital signals, the third A/D converter 218 converts the outputs of the green pixels 210 into digital signals and the fourth A/D converter 220 converts the outputs of the green pixels 212 into digital signals. The error compensation circuit 222 corrects the gain and the fixed pattern noise offset for each color channel, and the color interpolation circuit 224 performs the interpolation for each pixel 202 to determine the color of the pixel 202. The color interpolation circuit 224 may be located on a second chip 226, as shown in FIG. 2. Alternatively, the color interpolation circuit 224 may be located on chip 204.

Figure 3:
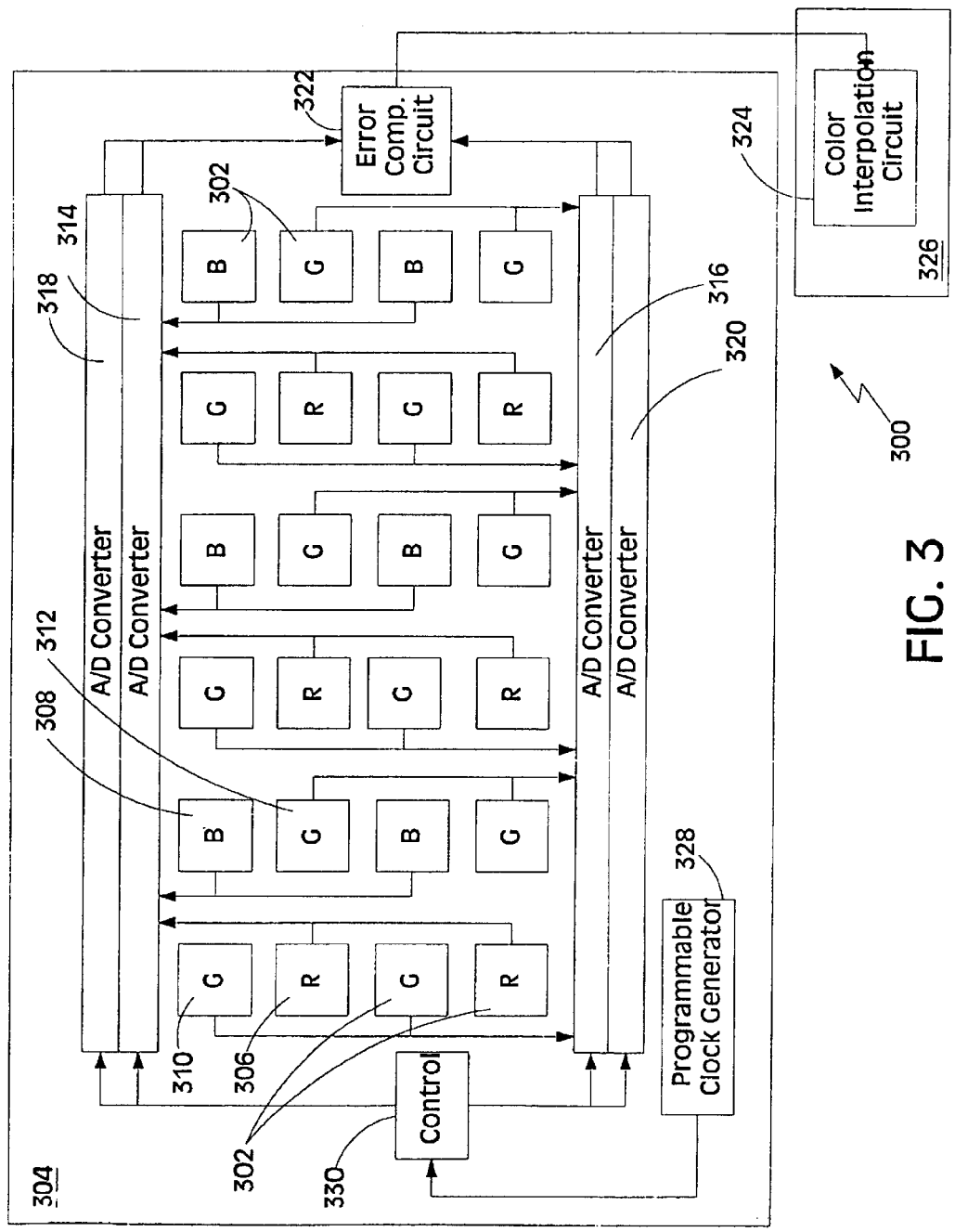
FIG. 3 illustrates a block diagram of a solid state imaging device having four analog-to-digital converters and a variable frame rate, in accordance with the present invention.

FIG. 3 illustrates a third example of a solid state imaging device 300 in accordance with the present invention. As with the previous examples, the solid state imaging device 300 comprises a two-dimensional array of image pixels 302 disposed on a chip 304, where each pixel 302 is either a red pixel 306, a blue pixel 308, or a green pixel 310, 312. The imaging device 300 also comprises four analog-to-digital converters 314, 316, 318, 320, an error compensation circuit 322 and a color interpolation circuit 324. The first analog-to-digital converter 314 converts the outputs of the red pixels 306 and the blue pixels 308 into digital signals. The second analog-to-digital converter 316 converts the outputs of the first and second green pixels 310, 312 into digital signals. The third analog-to-digital converter 318 converts the outputs of the blue pixels 308 into digital signals, and the fourth analog-to-digital converter 320 converts the outputs of the second green pixels 312 into digital signals. The error compensation circuit 322 is used to correct the gain and the fixed pattern noise offset for each pixel 302, and the color interpolation circuit 324 performs the interpolation for each pixel 302 to determine the color of the pixel 302. The color interpolation circuit 324 may be located on a second chip 326, as shown in FIG. 3. Alternatively, the color interpolation circuit 324 may be located on chip 304.

The imaging device 300 further comprises a programmable clock generator 328 and a control 330. The programmable clock generator 328 controls the frame rate of the solid state imaging device 300. The programmable clock generator 328 has a plurality of clock frequencies, including a first clock frequency and a second clock frequency. The first clock frequency is slower than the second clock frequency. The control 330 is coupled to the programmable clock generator 328 and the analog-to-digital converters 314, 316, 318, 320. The control 330 deactivates the third and fourth analog-to-digital converters 318, 320 if the programmable clock generator 328 is at the first clock frequency and activates the third and fourth analog-to-digital converters 318, 320 if the programmable clock generator 328 is at the second clock frequency. In addition, the control 330 sets the first analog-to-digital converter 314 to convert only the outputs of the red pixels 306 into digital signals, and sets the second analog-to-digital converter 316 to convert only the outputs of the first green pixels 310 into digital signals when the programmable clock generator 328 is at the second clock frequency.

The imaging device 300 can be employed to accommodate a plurality of frame rates. Very high frame rates (>60 FPS) are used for digital still applications to freeze motion, and lower frame rates (~30 FPS) are used for viewfinder or motion picture application. The variable frame rate saves power during continuous operation as the high frame rate for digital still application is employed only during the capture of a still picture at high shutter speed. When the frame rate is low, the imager core is clocked more slowly. As the frame rate is increased, a higher clock rate is applied to the imager core. For power savings, only two of the four analog-to-digital converters will be selected for low frame rates. When a high frame rate is selected, the additional analog-to-digital converters will be powered.

The use of multiple amplifiers and multiple A/D converters in a CMOS imager architecture raises the possibility of increased fixed pattern noise. To minimize fixed pattern noise, it is recommended that some averaging of adjacent green pixels be applied to blur any small offset between the third and fourth A/D converters. Since the rest of the color reconstruction is done by averaging over neighboring pixels, the impact of small mismatch between A/D converters will be minimal.

For digital still applications, the low light level performance will be at least 50% better with the high frame rate approach of the present invention. When low light pictures are taken, the high-speed capability will not be employed. The improved performance comes from increased light collection area afforded by the absence of a per pixel storage element. For example, a 4.0-micron pitch CMOS imager in deep submicron design rules will have a 25% fill factor for light collection when a four-transistor pixel with an integral storage node is employed. If this same 4.0-micron pixel pitch is employed to render a 3.0-transistor pixel without a storage node, then the fill factor of the pixel is 65%. This is a 2.6× improvement in signal-to-noise at low light levels.

The conventional four-transistor approach will not work as well as the 3.0-transistor pixel without a storage node in strong illumination. In addition, cross talk of 10% to 20% adds noise to the storage element when a conventional four-transistor cell is employed. In this instance, a high frame rate is still needed for exposures under strong illumination. Without a high frame rate, the four-transistor cell image data will be highly distorted by the cross talk from light received after the "electronic shutter is closed" but before the information can be read. Therefore, unless the cross talk can be completely suppressed, the four-transistor approach requires a high frame rate to succeed and collects only 39% of the low light signal as the new high frame rate approach.

The conventional four-transistor approach will not work as well as the high frame rate approach when working with modest light levels. With the four-transistor approach, a 2.6× longer exposure will be required just to achieve an acceptable signal-to-noise ratio. Thus, the range of situations in which sufficient light is available to freeze action is reduced compared to the high frame rate approach of the present invention.

In a 0.25 micron design rule, it is possible to have less than 10 electrons read noise while sustaining high data rates by multiplexing the per column analog circuits. To sustain a high overall frame rate, a very high speed A/D converter can be designed with up to 50 megapixel data rates. However, significantly lower power consumption can be achieved by the use of multiple A/D converters with each running at 25 to 30 megapixels per second.

Acceptable performance can be achieved by comparison to that of more commonly used cameras with a mechanical shutter. It is well accepted that for normal focal length lens (near 45 degree field of view), a minimum shutter speed for snap shot applications is about $1/60^{th}$ of a second. Acceptable results can be achieved for typical non-action subjects with shutter speeds as low as $1/30^{th}$ of a second in the very steady hands of a skilled photographer. Shutter speeds of $1/125^{th}$ of a second achieve acceptable motion capture for most casual photography. When shutter speed faster than about $1/100^{th}$ of a second are called for, the typical 35 mm camera no longer can open and close the shutter with sufficient speed. A moving slit approach is used with the width of the slit adjusted to control the exposure. This moving slit is very similar to the electronic scrolling shutter of a digital still camera. Therefore, it is safe to assume that frame rages of $1/60^{th}$ of a frame per second are adequate for low-end photography. It can also be estimated that a frame rate of $1/125^{th}$ of a second would do an excellent job (comparable to low end 35 mm camera systems) of stopping action for most camera users.

The minimum 60 frames per second can be achieved with up to about 2.0 million pixels and the application of four A/D converters. This can be accomplished without serious compromise on signal-to-noise and fixed pattern noise. The overall performance will be superior to a four-transistor design of the same pitch. Video frame rates of 30 frames per second can be achieved with four low power A/D converters for imager sized up to four million pixels. In addition, for applications such as movie making and television where power consumption is not an issue, even higher data rates and frame rates can be achieved by a CMOS approach with multiple A/D converters.

While various embodiments of the application have been described, it will be apparent to those of ordinary skill in the art that many more embodiments and implementations are possible that are within the scope of this invention. Accordingly, the invention is not to be restricted except in light of the attached claims and their equivalents.

What is claimed:

1. A solid state imaging device, comprising:
   a red pixel having an output;
   a blue pixel having an output;
   a first green pixel having an output;
   a second green pixel having an output;
   a first analog-to-digital converter connected to the output of the red pixel for converting the output of the red pixel into a first digital signal and connected to the output of the blue pixel for converting the output of the blue pixel into a second digital signal;
   a second analog-to-digital converter connected to the output of the first green pixel for converting the output of the first green pixel into a third digital signal and connected to the output of the second green pixel for converting the output of the second green pixel into a fourth digital signal; and
   a color interpolation circuit for combining the first, second, third and fourth digital signals.

2. The solid state imaging device of claim 1, further comprising an error compensation circuit for correcting a gain of one of the output of the red pixel, the output of the blue pixel, the output of the first green pixel and the output of the second green pixel.

3. The solid state imaging device of claim 1, further comprising an error compensation circuit for correcting a fixed pattern noise offset from one of the output of the red pixel, the output of the blue pixel, the output of the first green pixel and the output of the second green pixel.

4. The solid state imaging device of claim 1 further comprising a first chip and a second chip, wherein the red pixel, the blue pixel, the first green pixel, the second green pixel, the first analog-to-digital converter and the second analog-to-digital converter are disposed on the first chip and the color interpolation circuit is disposed on the second chip.

5. The solid state imaging device of claim 1 further comprising a chip, wherein the red pixel, the blue pixel, the first green pixel, the second green pixel, the first analog-to-digital converter, the second analog-to-digital converter and the color interpolation circuit are disposed on the chip.

6. The solid state imaging device of claim 1, further comprising:
   a third analog-to-digital converter connected to the output of the blue pixel for converting the output of the blue pixel into a fifth digital signal;
   a fourth analog-to-digital converter connected to the output of the second green pixel for converting the output of the second green pixel into a sixth digital signal;
   a programmable clock generator having a first clock frequency and a second clock frequency, wherein the first clock frequency is slower than the second clock frequency; and
   a control coupled to the programmable clock generator, the first analog-to-digital converter, the second analog-to-digital converter, the third analog-to-digital converter and the fourth analog-to-digital converter,
   wherein, if the programmable clock generator is at the first clock frequency, the control deactivates the third and fourth analog-to-digital converters, and sets the first analog-to-digital converter to convert the output of the blue pixel into the second digital signal and the second analog-to-digital converter to convert the output of the second green pixel into the fourth digital signal, and
   wherein, if the programmable clock generator is at the second clock frequency, the control activates the third analog-to-digital converter to convert the output of the blue pixel into the fifth digital signal and the fourth analog-to-digital converter to convert the output of the second green pixel into the sixth digital signal, and sets the first analog-to-digital converter not to convert the output of the blue pixel into the second digital signal and the second analog-to-digital converter not to convert the output of the second green pixel into the fourth digital signal.

7. The solid state imaging device of claim 6, wherein the first analog-to-digital converter converts the output of the red pixel and the second analog-to-digital converter converts the output of the first green pixel when the programmable clock generator is at the second clock frequency.

8. The solid state imaging device of claim 6, wherein the programmable clock generator controls a frame rate of the solid state imaging device.

9. The solid state imaging device of claim 6, wherein the programmable clock generator comprises a plurality of clock frequencies.

10. The solid state imaging device of claim 6 further comprising a first chip and a second chip, wherein the red pixel, the blue pixel, the first green pixel, the second green pixel, the first analog-to-digital converter, the second analog-to-digital converter, the third analog-to-digital converter, the fourth analog-to-digital converter, the programmable clock generator and the control are disposed on the first chip and the color interpolation circuit is disposed on the second chip.

11. The solid state imaging device of claim 6 further comprising a chip, wherein the red pixel, the blue pixel, the first green pixel, the second green pixel, the first analog-to-digital converter, the second analog-to-digital converter, the third analog-to-digital converter, the fourth analog-to-digital converter, the programmable clock generator, the control and the color interpolation circuit are disposed on the chip.

12. The solid state imaging device of claim 6, wherein the fifth digital signal is substantially the same as the second digital signal and the sixth digital signal is substantially the same as the fourth digital signal.

13. A solid state imaging device, comprising:
groups of pixels, wherein each of said groups of pixels include:
a red pixel having an output;
a blue pixel having an output;
a first green pixel having an output; and
a second green pixel having an output;
a first analog-to-digital converter connected to the output of the red pixel for converting the output of the red pixels into a first digital signal and connected to the output of the blue pixel for converting the output of the blue pixels into a second digital signal;
a second analog-to-digital converter connected to the output of the first green pixel for converting the output of the first green pixels into a third digital signal and connected to the output of the second green pixel for converting the output of the second green pixels into a fourth digital signal; and
a color interpolation circuit for combining the first, second, third and fourth digital signals.

14. The solid state imaging device of claim 13 further comprising a first chip and a second chip, wherein the groups of pixels, the first analog-to-digital converter and the second analog-to-digital converter are disposed on the first chip and the color interpolation circuit is disposed on the second chip.

15. The solid state imaging device of claim 13 further comprising a chip, wherein the groups of pixels, the first analog-to-digital converter, the second analog-to-digital converter and the color interpolation circuit are disposed on the chip.

16. The solid state imaging device of claim 13, further comprising:
a third analog-to-digital converter connected to the output of the blue pixel for converting the output of the blue pixels into a fifth digital signal;
a fourth analog-to-digital converter connected to the output of the second green pixel for converting the output of the second green pixels into a sixth digital signal;
a programmable clock generator having a first clock frequency and a second clock frequency, wherein the first clock frequency is slower than the second clock frequency; and
a control coupled to the programmable clock generator, the first analog-to-digital converter, the second analog-to-digital converter, the third analog-to-digital converter and the fourth analog-to-digital converter,
wherein, if the programmable clock generator is at the first clock frequency, the control deactivates the third and fourth analog-to-digital converters, and sets the first analog-to-digital converter to convert the output of the blue pixels into the second digital signal and the second analog-to-digital converter to convert the output of the second green pixels into the fourth digital signal, and
wherein, if the programmable clock generator is at the second clock frequency, the control activates the third analog-to-digital converter to convert the output of the blue pixels into the fifth digital signal and the fourth analog-to-digital converter to convert the output of the second green pixels into the sixth digital signal, and sets the first analog-to-digital converter not to convert the output of the blue pixels into the second digital signal and the second analog-to-digital converter not to convert the output of the second green pixels into the fourth digital signal.

17. The solid state imaging device of claim 16, wherein the fifth digital signal is substantially the same as the second digital signal and the sixth digital signal is substantially the same as the fourth digital signal.

18. An imaging method comprising:
converting an output of a red pixel into a first digital signal using a first analog-to-digital converter;
converting an output of a blue pixel into a second digital signal using the first analog-to-digital converter;
converting an output of a first green pixel into a third digital signal using a second analog-to-digital converter;
converting an output of a second green pixel into a fourth digital signal using the second analog-to-digital converter; and
combining the first, second, third and fourth digital signals using a color interpolation circuit.

19. The imaging method of claim 18 further comprising: correcting a gain of one of the output of the red pixel, the output of the blue pixel, the output of the first green pixel and the output of the second green pixel.

20. The imaging method of claim 18 further comprising: correcting a fixed pattern noise offset from one of the output of the red pixel, the output of the blue pixel, the output of the first green pixel and the output of the second green pixel.

21. The imaging method of claim 18, wherein the red pixel, the blue pixel, the first green pixel, the second green pixel, the first analog-to-digital converter and the second analog-to-digital converter are disposed on a first chip and the color interpolation circuit is disposed on a second chip.

22. The imaging method of claim 18, wherein the red pixel, the blue pixel, the first green pixel, the second green pixel, the first analog-to-digital converter, the second analog-to-digital converter and the color interpolation circuit are disposed on a chip.

* * * * *